（12) United States Patent
Boutillon et al.

(10) Patent No.: US 8,645,787 B2
(45) Date of Patent: Feb. 4, 2014

(54) METHOD FOR CONTROLLING A BASIC PARITY NODE OF A NON-BINARY LDPC CODE DECODER, AND CORRESPONDING BASIC PARITY NODE PROCESSOR

(75) Inventors: Emmanuel Boutillon, Lorient (FR); Laura Conde-Canencia, Lorient (FR)

(73) Assignees: Universite de Bretagne Sud, Lorient (FR); Centre National de la Recherche Scientifique-CNRS, Paris (FR)

( * ) Notice: Subject to any disclaimer, the term of this patent is extended or adjusted under 35 U.S.C. 154(b) by 60 days.

(21) Appl. No.: 13/319,033

(22) PCT Filed: May 5, 2010

(86) PCT No.: PCT/FR2010/050856
§ 371 (c)(1),
(2), (4) Date: May 25, 2012

(87) PCT Pub. No.: WO2010/128248
PCT Pub. Date: Nov. 11, 2010

(65) Prior Publication Data
US 2012/0240002 A1 Sep. 20, 2012

(30) Foreign Application Priority Data

May 5, 2009 (FR) .................................... 09 52988

(51) Int. Cl.
*H03M 13/00* (2006.01)
*G06F 11/00* (2006.01)
(52) U.S. Cl.
USPC ........................................ 714/752; 714/799
(58) Field of Classification Search
USPC .......... 714/752, 758, 759, 777, 786, 799, 780
See application file for complete search history.

(56) References Cited

U.S. PATENT DOCUMENTS

| 7,590,914 B2 * | 9/2009 | Kim et al. ...................... 714/752 |
| 8,370,711 B2 * | 2/2013 | Alrod et al. .................... 714/763 |
| 2009/0183047 A1* | 7/2009 | Lampe et al. .................. 714/752 |

OTHER PUBLICATIONS

Voicila, Adrian, et al., "Low-complexity, Low-memory EMS algorithm for non-binary LDPC codes," Proc., *IEEE International Conference on Communication*, Jun. 1, 2007, pp. 671-676.
Voicila, Adrian, et al., "Architecture of a low-complexity non-binary LDPC decoder for high order fields," *IEEE International Symposium on Communications and Information Technologies*, Oct. 1, 2007, pp. 1201-1206.

(Continued)

*Primary Examiner* — Christine Tu
(74) *Attorney, Agent, or Firm* — Patterson Thuente Pedersen, P.A.

(57) ABSTRACT

A method for controlling an elementary parity node of a decoder for decoding non-binary LDPC codes or a code decoder using at least one non-binary parity constraint, and to the corresponding elementary parity node. The elementary parity node receives first and second input lists ($U_1$, $U_2$) having $n_m$ elements sorted in ascending or descending order, $n_m$ being greater than 1, and gives an output list ($U_{out}$) of $n_{m'}$ elements sorted in said ascending or descending order, $n_{m'}$ being greater than 1, each element of the output list ($U_{out}$) being the result of a computing operation $\phi$ between an element of the first input list ($U_1$) and an element of the second input list ($U_2$). A limited number of candidates is selected for each element of the output list to be generated so as to reduce the number of operations to be carried out in the elementary parity node.

8 Claims, 2 Drawing Sheets

(56) References Cited

OTHER PUBLICATIONS

Declercq, David, et al., "Decoding Algorithms for Nonbinary LDPC Codes Over GF($q$)," *IEEE Transactions on Communications*, vol. 55, No. 4, Apr. 2007, pp. 633-643.

Barnault, L., et al., "Fast Decoding Algorithm for LDPC over GF($2^q$)," *Information Theory Workshop, 2003, Proceedings, 2003 IEEE*, Mar. 31, 2003, pp. 70-73.

Song, Hongxin, "Reduced-Complexity Decoding of $Q$-ary LDPC Codes for Magnetic Recording," *IEEE Transactions on Magnetics*, vol. 39, No. 2, Mar. 2003, pp. 1081-1087.

\* cited by examiner

METHOD FOR CONTROLLING A BASIC PARITY NODE OF A NON-BINARY LDPC CODE DECODER, AND CORRESPONDING BASIC PARITY NODE PROCESSOR

PRIORITY CLAIM

The present application is a National Phase entry of PCT Application No. PCT/FR2010/050856, filed May 5, 2010, which claims priority from French Application No. 0952988, filed May 5, 2009, the disclosures of which are hereby incorporated by reference herein in their entirety.

TECHNICAL FIELD

The present invention relates to a method for controlling an elementary parity node of a decoder for decoding non-binary LDPC codes or a code decoder using at least one non-binary parity constraint, and to the corresponding elementary parity node.

BACKGROUND ART

LDPC (Low Density Parity Check) codes are known error-correcting codes for approaching Shannon's theoretical limit of transmission. Because of their performance in terms of noise immunity, LDPC codes, and in particular non-binary LDPC codes, find use in the field of transmitting and storing digital data.

Non-binary LDPC codes are constructed in a non-binary Galois field of order q, conventionally written as GF(q). An LDPC code in GF(q) is defined by a sparse parity matrix H of dimensions M×N, the elements of which belong to GF(q), N being the number of GF(q) elements in the code word and M being the number of parity constraints. For a Galois field GF(4) consisting of 4 elements $\{0, \alpha^0, \alpha^1, \alpha^2\}$, the parity matrix for N=6 and M=3, for example, is as follows:

$$H = \begin{pmatrix} 0 & \alpha^0 & \alpha^0 & 0 & \alpha^2 & 0 \\ \alpha^1 & 0 & 0 & \alpha^0 & 0 & \alpha^2 \\ \alpha^0 & 0 & \alpha^2 & 0 & 0 & \alpha^1 \end{pmatrix}$$

This matrix can likewise be shown by a bipartite graph (Tanner graph) having N variable nodes receiving the symbols of the code word and M parity nodes. Each column of the parity matrix is associated with a variable node and each line of the matrix is associated with a parity node. In the case of a regular LDPC code, each parity node is connected, by means of $d_c$ branches, to a single number $d_c$ of variable nodes. Similarly, each variable node is connected, by means of $d_v$ branches, to a single number $d_v$ of parity nodes. In the case of a regular LDPC code, the number $d_c$ or $d_v$ of branches varies according to the variable node or parity node.

The decoding of these LDPC codes is iterative and consists in exchanging messages via these branches, each variable or parity node processing the messages received and, after processing, delivering other messages, as the case may be, to parity nodes or variable nodes to which they are connected via branches. The exchanged messages represent probability density functions of the code symbols and are therefore in the form of vectors of size q. Such decoding is described in the document entitled "Decoding Algorithms for Nonbinary LDPC Codes Over GF(q)" by D. Declercq and M. Fossorier, Communications IEEE Transactions in Volume 55, Issue 4, April 2007, pages 633-643.

The invention specifically relates to the method for controlling parity nodes of the decoder. With reference to FIG. 1, each parity node P receives a plurality of incoming messages $U_i$ and delivers outgoing messages $V_j$, with $i \in [0 \ldots dv-1]$, such that $$V_j = \bigoplus_{j \neq i} U_i$$

where $\oplus$ is the probability density function operator associated with the addition of the Galois field GF(q).

In the example of FIG. 1, the parity node receives $d_c=4$ incoming messages $U_0, U_1, U_2, U_3$ and delivers 4 outgoing messages $V_0, V_1, V_2, V_3$ such as:

$$\begin{cases} V_0 = U_1 \oplus U_2 \oplus U_3 \\ V_1 = U_0 \oplus U_2 \oplus U_3 \\ V_2 = U_0 \oplus U_1 \oplus U_3 \\ V_3 = U_0 \oplus U_1 \oplus U_2 \end{cases}$$

Each one of these calculations can be broken down into elementary calculations performed by elementary parity nodes having two inputs and one output.

For example, to calculate $V_0$, a first elementary parity node carries out the operation $U_1 \oplus U_2 = U_{int}$ and then a second elementary parity node carries out the operation $U_{int} \oplus U_3$. It should be noted that the intermediate result $U_{int}$ at the output of the first elementary parity node is likewise used to calculate $V_3$.

In this way, each parity node can be broken down into a plurality of elementary parity nodes each receiving two incoming messages, e.g., $U_1$ and $U_2$, and delivering one outgoing message $U_{out} = U_{int}$. Such a node is shown schematically in FIG. 2. Each incoming and outgoing message is a vector of size q, associating a probability density with each element of the Galois field. In the remainder of the description, for illustrative purposes, a Galois field GF(4) is considered to consist of the elements $\{0, \alpha^0, \alpha^1, \alpha^2\}$ the laws of addition and multiplication of which are defined by the following tables:

| $\oplus$ | 0 | $\alpha^0$ | $\alpha^1$ | $\alpha^2$ |
|---|---|---|---|---|
| 0 | 0 | $\alpha^0$ | $\alpha^1$ | $\alpha^2$ |
| $\alpha^0$ | $\alpha^0$ | 0 | $\alpha^2$ | $\alpha^1$ |
| $\alpha^1$ | $\alpha^1$ | $\alpha^2$ | 0 | $\alpha^0$ |
| $\alpha^2$ | $\alpha^2$ | $\alpha^1$ | $\alpha^0$ | 0 |

| $\otimes$ | 0 | $\alpha^0$ | $\alpha^1$ | $\alpha^2$ |
|---|---|---|---|---|
| 0 | 0 | 0 | 0 | 0 |
| $\alpha^0$ | 0 | $\alpha^0$ | $\alpha^1$ | $\alpha^2$ |
| $\alpha^1$ | 0 | $\alpha^1$ | $\alpha^2$ | $\alpha^0$ |
| $\alpha^2$ | 0 | $\alpha^2$ | $\alpha^0$ | $\alpha^1$ |

The incoming messages, for example, are $U_1 = (a_0, a_1, a_2, a_3)$ and $U_2 = (b_0, b_1, b_2, b_3)$ where $a_i$ is the probability density function associated with the element $\alpha^i$ in the message $U_1$ and where $b_i$ is the probability density function associated with the element $\alpha^i$ in the message $U_2$, $i \in [0 \ldots 3]$, with $a_0 + a_1 + a_2 + a_3 = 1$ and $b_0 + b_1 + b_2 + b_3 = 1$.

Taking account of the law of addition defined above for the Galois field GF(4), the outgoing message $U_{out}$ is equal to $U_{out} = (c_0, c_1, c_2, c_3)$ where $$c_0 = a_0 \cdot b_0 + a_1 \cdot b_1 + a_2 \cdot b_2 + a_3 \cdot b_3$$

$$c_1 = a_0 \cdot b_1 + a_1 \cdot b_0 + a_3 \cdot b_2 + a_2 \cdot b_3$$

$$c_2 = a_0 \cdot b_2 + a_1 \cdot b_3 + a_2 \cdot b_0 + a_3 \cdot b_1$$

$$c_3 = a_0 \cdot b_3 + a_1 \cdot b_2 + a_2 \cdot b_1 + a_3 \cdot b_0$$

Density probability functions are thus exchanged between the parity nodes and the variable nodes, and conversely, until the code word has been completely decoded. Reference is then made to a "belief propagation" algorithm.

Implementing such an algorithm is relatively complex and requires that $q^2$ multiplications be carried out in each elementary parity node for elements belonging to GF(q).

In order to reduce this complexity, it is known to work in the logarithmic field in order to convert the multiplications into additions. The data exchanged between nodes are log likelihood ratios (LLR).

To calculate the probability density functions of the outgoing message, another known solution for reducing said complexity consists in taking account solely of the $n_m$ greatest probability density functions in the incoming messages, $n_m < q$. This algorithm, referred to as EMS (Extended Min-Sum), is described in detail in the document entitled "Algorithmes simplifies pour le decodage de codes LDPC non binaires" de A. Voicila, D. Declercq, M. Fossorier et F. Verdier, GRETSI, Louvain-la-Neuve, Belgium, September 2005. This solution can be combined with the preceding solution such that the data exchanged are log likelihood ratios.

According to this algorithm, the incoming messages $U_1$ and $U_2$ are filtered and sorted prior to being processed by the elementary parity node. The messages supplied to the elementary parity node are then lists comprising only $n_m$ probability density function values or LLR sorted in descending order, each probability density function or LLR value being associated with an element of the Galois field GF(q). The number of probability function or LLR values taken into account by the elementary parity node being reduced ($n_m < q$), the complexity of this algorithm is reduced but remains high nonetheless. A method employing an algorithm enabling the number of calculations in the elementary parity nodes to be yet further reduced would present decided advantages.

SUMMARY OF THE INVENTION

The present invention proposes a method for controlling an elementary parity node of a decoder for decoding non-binary LDPC codes or a code decoder using at least one non-binary parity constraint, said elementary parity node receiving first and second lists, called first and second input lists, having $n_m$ elements sorted in a order defined among a descending order and an ascending order, $n_m$ being greater than 1, and delivering a list, called output list, having $n_m'$ elements sorted in said defined order, $n_m'$ being greater than 1, each element of the output list being the result of a computing operation $\phi$ between an element of the first input list and an element of the second input list, said computing operation $\phi$ being such that, if $a \geq b$ and $c \geq d$, then $\phi(a, c) \geq \phi(b, d)$, said method being characterized in that it includes the following steps:

a) selecting the p first elements of the first input list and the first element of the second input list, p being a predetermined number less than $n_m$, b) carrying out computing operations $\phi$ between the elements selected from the first input list and the element selected from the second input list so as to generate a list of p candidate elements for the output list, c) determining, from the p candidate elements, the candidate element having the highest value if the defined order is the descending order, or the candidate element having the lowest value if the defined order is the ascending order, and inserting it into the output list, the candidate element inserted into the output list being the result of the computing operation $\phi$ between an element of order i of the first input list and an element of order j of the second input list, i and j being between 1 and $n_m$, d) selecting, according to a predetermined criterion, the element of order i of the first input list and the element of order j+1 of the second input list or the element of order i+1 of the first input list and the element of order j of the second input list, e) carrying out a computing operation $\phi$ between the elements selected in the preceding step so as to generate a new candidate element, and replacing, in the list of p candidate elements, the last candidate element inserted into the output list by said new candidate element, f) determining, from amongst the p candidate elements, the candidate element having the highest value if the defined order is the descending order, or the candidate element having the lowest value if the defined order is the ascending order, and inserting it into the output list in the order of determination, the candidate element inserted into the output list being the result of the computing operation between an element of order i of the first input list and an element of order j of the second input list, and g) repeating steps d) to f) until the output list comprises $n_m'$ elements.

In this way, according to the invention, the list of candidate elements for each element of the output list comprises only $p < n_m$ elements, thereby enabling the number of calculations and comparisons of the method to be reduced.

According to one advantageous embodiment, the number p is assumed to be equal to $$\left\lceil \frac{-1 + \sqrt{-7 + 8n_m'}}{2} \right\rceil$$

which represents the number of possible candidates for each element of the output list and where $\lceil x \rceil$ represents the smallest integer greater than or equal to real number x.

According to a first predetermined criterion, the selection made in step d) depends solely on the order i of the element of the first input list and/or the order j of the element of the second input list associated with the candidate element inserted into the output list.

According to a second predetermined criterion, the selection made in step d) depends not only on the order i of the element of the first input list and/or the order j of the element of the second input list associated with the candidate element inserted into the output list, but also on the flag representative of the selection made in the preceding step d).

Within the context of decoding non-binary LDPC codes, the elements of the first and second input lists are probability densities or LLR values each associated with a symbol in a Galois field. Within this context, and according to a particular embodiment, after determining the candidate element having the lowest or highest value, the step f) further includes a step for determining the symbol associated with said determined candidate element, said determined candidate element being inserted into the output list if and only if the symbol associated with said determined candidate element is not associated with a candidate element already present in the output list, i.e., with the candidate element inserted into the output list in step c) or with an candidate element inserted into the output list in a preceding step f).

The invention likewise relates to an elementary parity node for decoding non-binary LDPC codes or a code decoder using at least one non-binary parity constraint, including:

first and second inputs for receiving first and second lists, called first and second input lists, having $n_m$ elements sorted in an order defined among a descending order and an ascending order, $n_m$ being greater than 1, an output for delivering a list, referred to as an output list, having $n_m'$ elements sorted in the defined order, $n_m'$ being greater than or equal to 1, each element of the output list being the result of a computing operation $\phi$ between an element of the first input list and an element of the second input list, said computing operation $\phi$ being such that, if a≥b and c≥d then $\phi(a, c) \geq \phi(b, d)$, first storage means for storing the elements of said first and second input lists, a computing circuit for carrying out computing operations $\phi$ between elements of the first input list and elements of the second input list, which are stored in said first storage means, so as to generate a candidate element upon each operation, second storage means for storing the candidate elements computed by said computing means, a comparison circuit for determining, from amongst the candidate elements stored in the second storage means, the candidate element having the highest value if the defined order is the descending order, or the candidate element having the lowest value if the defined order is the ascending order, and providing said determined candidate element to the output, the candidate element provided to the output being the result of the computing operation $\phi$ between an element of order i of the first input list and an element of order j of the second input list, i and j being between 1 and $n_m$, and a control circuit for controlling the selection of the elements stored in said first storage means, to be provided to the computing circuit and the storage of the computed candidate elements in the second storage means, characterized in that the second storage means include p registers for storing p candidate elements, p being a predetermined number lower than $n_m$, in that said comparison circuit is capable of providing information to the control circuit, which is representative of the orders i and j associated with the candidate element provided to the output, and the control circuit is capable of controlling said first storage means and said second storage means for implementing the previously defined control method.

BRIEF DESCRIPTION OF THE DRAWINGS

The invention will be better understood, and other aims, details, characteristics and advantages will become more apparent from the following explanatory description of embodiments of the invention, with reference to the appended drawings, in which.

DETAILED DESCRIPTION

Figure 1:
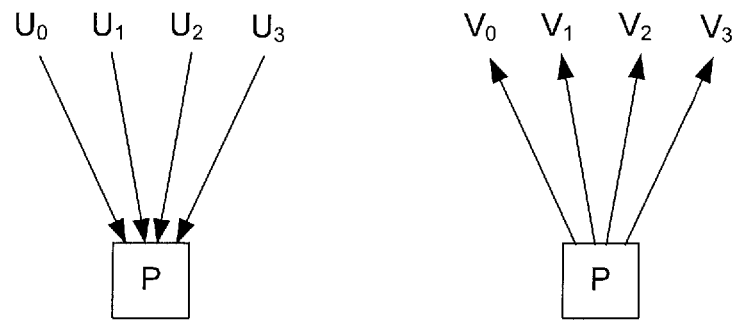
FIG. 1, which has already been described, is a schematic representation of a parity node receiving four incoming messages (left-hand portion of the Figure) and delivering four outgoing messages (right-hand portion of the Figure); and, FIG. 2, which has already been described, is a schematic representation of an elementary parity node receiving two incoming messages and delivering one outgoing message.
Figure 2:
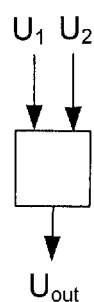

In the description which follows, an elementary parity node is considered, receiving as input lists of $n_m$ elements sorted in descending order and delivering as output a list of $n_m$ elements likewise sorted in descending order. It is likewise considered that this elementary parity node works in the logarithmic field, the data exchanged between nodes then being LLR values.

More specifically, the invention will be described hereinbelow with reference to an elementary parity node receiving, as incoming messages, two input lists $U_1$ and $U_2$ having $n_m$ LLR values sorted in descending order and delivering, as outgoing messages, an output list $U_{out}$ having $n_m'$ LLR values, with $n_m' > 1$.

The elements of lists $U_1$ and $U_2$ are written as $U_1(i)$ and $U_2(j)$, respectively, with $i=1 \ldots n_m$ and $j=1 \ldots n_m$. Since these lists are sorted in descending order, we have:

$$\forall i \epsilon [1, n_m-1], U_1(i) \geq U_1(i+1), \text{ and}$$

$$\forall j \epsilon [1, n_m-1], U_2(j) \geq U_2(j+1).$$

The output list $U_{out}$ includes $n_m'$ values corresponding to the highest $n_m'$ LLR values of the set $U_\phi = U_\Sigma = \{(i, j) \epsilon [1, n_m]^2, U_1(i)+U_2(j)\}$ sorted in descending order. The set $U_\Sigma$ is obtained from the matrix $T_\Sigma$ of size $n_m * n_m$ wherein each element $T_\Sigma(i,j) = U_1(i) + U_2(j)$ with $i=1 \ldots n_m$ et $j=1 \ldots n_m$.

In order to properly understand the method of the invention and the advantages thereof, we will first describe, for illustrative purposes, the process for generating the output list $U_{out}$ according to the EMS algorithm of the prior art. Each of the input lists $U_1$ and $U_2$ comprises a limited number of elements corresponding to the $n_m$ highest LLR values contained in each of the incoming messages of the elementary parity node.

In this example, two input lists $U_1 = \{90, 87, 60, 55, 54, 30, 29, 23, 18, 17\}$ and $U_2 = \{90, 81, 73, 60, 59, 49, 31, 30, 29, 28\}$ are taken into consideration. Each of these input lists comprises $n_m = 10$ elements. An output list $U_{out}$ comprising $n_m' = 15$ elements is sought.

The matrix $T_\Sigma$ is then defined by the following table:

TABLE 1

|  |  | $U_2(1)$ 90 | $U_2(2)$ 81 | $U_2(3)$ 73 | $U_2(4)$ 60 | $U_2(5)$ 59 | $U_2(6)$ 49 | $U_2(7)$ 31 | $U_2(8)$ 30 | $U_2(9)$ 29 | $U_2(10)$ 28 |
|---|---|---|---|---|---|---|---|---|---|---|---|
| $U_1(1)$ | 90 | 180 | 171 | 163 | 150 | 149 | 139 | 121 | 120 | 119 | 118 |
| $U_1(2)$ | 87 | 177 | 168 | 160 | 147 | 146 | 136 | 118 | 117 | 116 | 115 |
| $U_1(3)$ | 60 | 150 | 141 | 133 | 120 | 119 | 109 | 91 | 90 | 89 | 88 |
| $U_1(4)$ | 55 | 145 | 136 | 128 | 115 | 114 | 104 | 86 | 85 | 84 | 83 |
| $U_1(5)$ | 54 | 144 | 135 | 127 | 114 | 113 | 103 | 85 | 84 | 83 | 82 |

TABLE 1-continued

|  | $U_2(1)$ 90 | $U_2(2)$ 81 | $U_2(3)$ 73 | $U_2(4)$ 60 | $U_2(5)$ 59 | $U_2(6)$ 49 | $U_2(7)$ 31 | $U_2(8)$ 30 | $U_2(9)$ 29 | $U_2(10)$ 28 |
|---|---|---|---|---|---|---|---|---|---|---|
| $U_1(6)$ | 30 | 120 | 111 | 103 | 90 | 89 | 79 | 61 | 60 | 59 | 58 |
| $U_1(7)$ | 29 | 119 | 110 | 102 | 89 | 88 | 78 | 60 | 59 | 58 | 57 |
| $U_1(8)$ | 23 | 113 | 104 | 96 | 83 | 82 | 72 | 54 | 53 | 52 | 51 |
| $U_1(9)$ | 18 | 108 | 99 | 91 | 78 | 77 | 67 | 49 | 48 | 47 | 46 |
| $U_1(10)$ | 17 | 107 | 98 | 90 | 77 | 76 | 66 | 48 | 47 | 46 | 45 |

To generate the output list $U_{out}$, the elementary parity node is controlled as follows. First of all, the $n_m$ elements of list $U_1$ and the first element of list $U_2$ are selected, and the additions $n_m$ corresponding to the first column of the table are carried out. In this way, a list of $n_m$ candidate elements is obtained for the first element of the list $U_{out}$. The element having the highest value is extracted from the list of candidates by comparing the candidate elements to one another ($n_m$ comparisons). This element, which is $T_\Sigma(1,1)$, is the first element of the output list $U_{out}$. Next, in the list of candidates, the extracted candidate element $T_\Sigma(1,1)$ by element $T_\Sigma(1,2)$, which is the element of the line i=1 having the highest value amongst the elements not yet extracted from this line, the element $T_\Sigma(1,2)$ having been previously obtained by selecting elements $U_1(1)$ and $U_2(2)$ and by adding them. The element having the highest value is then extracted from this new candidate list. The extracted element is the second element of the list $U_{out}$. One proceeds in this way until an output list comprising $n_m'$ values is obtained. At each iteration, the extracted element $T_\Sigma(i,j)$ is replaced by the element $T_\Sigma(i,j+1)$, which is the element from line i having the highest value from amongst the elements not yet extracted from this line. In the end, the following output list is obtained: $U_{out}$={180, 177, 171, 168, 163, 160, 150, 150, 149, 147, 146, 145, 144, 141, 136}.

According to this EMS algorithm, the elementary parity node carries out, for the first iteration (generation of the first element of the list $U_{out}$), $n_m$ additions and $n_m$ comparisons and, for each of the following iterations (generation of the $n_m'-1$ last elements of the list $U_{out}$), 1 addition and $n_m$ comparisons. Generation of the complete list $U_{out}$ ($n_m'$ elements) therefore requires the execution of $n_m+n_m'-1$ additions and $n_m*n_m'$ comparisons.

The method of the invention aims to reduce this number of operations. The method of the invention will now be described in detail.

Given that lists $U_1$ and $U_2$ are sorted in descending order, the following properties exist:

$$\forall j \in [1, n_m] \text{ and } i > i', \text{ then } T_\Sigma(i,j) > T_\Sigma(i',j) \quad (1)$$

$$\forall i \in [1, n_m] \text{ and } j > j', \text{ then } T_\Sigma(i,j) > T_\Sigma(i,j') \quad (2)$$

The consequence of these two properties is that the highest value of the matrix $T_\Sigma$ is $T_\Sigma(1,1)$. The next highest value of the matrix is either $T_\Sigma(2,1)$, or $T_\Sigma(1,2)$. Only two candidates are therefore possible for the second element of list $U_{out}$.

More generally speaking, the number of possible candidates for the $n^{th}$ element of the output list $U_{out}$ can be determined by the function $$\psi(n) = \left\lceil \frac{-1+\sqrt{-7+8n}}{2} \right\rceil \quad (3)$$

where $\lceil y \rceil$ is the function defining the smallest natural integer greater than or equal to the real number y.

This function is deduced from the following tables showing the matrix $T_\Sigma$. In these tables, a cross X represents a candidate element previously selected from the list $U_{out}$ and a circle O represents a possible candidate to be the next element of the list $U_{out}$. If $n_m=5$, then the matrix $T_\Sigma$ shown includes 5 columns and 5 lines. As indicated previously, the first element of the output list $U_{out}$ is mandatorily the element $T_\Sigma(1,1)$. A cross X is therefore shown in the corresponding box of the table.

There are two possible candidates for determining the second element of the list $U_{out}$ (n=2), which are $T_\Sigma(2,1)$ and $T_\Sigma(1,2)$, as shown in the following table:

TABLE 2

|  | $U_1(1)$ | $U_1(2)$ | $U_1(3)$ | $U_1(4)$ | $U_1(5)$ |
|---|---|---|---|---|---|
| $U_2(1)$ | X | O |  |  |  |
| $U_2(2)$ | O |  |  |  |  |
| $U_2(3)$ |  |  |  |  |  |
| $U_2(4)$ |  |  |  |  |  |
| $U_2(5)$ |  |  |  |  |  |

The following tables are for determining the third element (n=3) of the list $U_{out}$: table 3 shows the case in which the element $T_\Sigma(1,2)$ is the second element of the list $U_{out}$ and table 4 shows the other case (case in which the element $T_\Sigma(2,1)$ is the second element of the list $U_{out}$). In both cases, there are two possible candidates O for extracting the third element.

TABLE 3

| X | X | O |  |  |
|---|---|---|---|---|
| O |  |  |  |  |
|  |  |  |  |  |
|  |  |  |  |  |
|  |  |  |  |  |

TABLE 4

| X | O |  |  |  |
|---|---|---|---|---|
| X |  |  |  |  |
| O |  |  |  |  |
|  |  |  |  |  |
|  |  |  |  |  |

For determining the fourth element (n=4) of the list $U_{out}$, there are the following tables:

TABLE 5

| X | X | X | O |   |
|---|---|---|---|---|
| O |   |   |   |   |
|   |   |   |   |   |
|   |   |   |   |   |
|   |   |   |   |   |

TABLE 6

| X | X | O |   |   |
|---|---|---|---|---|
| X | O |   |   |   |
| O |   |   |   |   |
|   |   |   |   |   |
|   |   |   |   |   |

TABLE 7

| X | O |   |   |   |
|---|---|---|---|---|
| X |   |   |   |   |
| X |   |   |   |   |
| O |   |   |   |   |
|   |   |   |   |   |

Table 6 shows the most disadvantageous case (the case wherein the number of possible candidates is the highest) with 3 possible candidates.

Otherwise, the most disadvantageous cases, wherein the number of possible candidates is greater than 3, are obtained in order to determine the seventh element (n=7) and the eleventh element (n=11) of the list $U_{out}$. These cases are shown in the following tables:

TABLE 8

| X | X | X | O |   |
|---|---|---|---|---|
| X | X | O |   |   |
| X | O |   |   |   |
| O |   |   |   |   |
|   |   |   |   |   |

TABLE 9

| X | X | X | X | O |
|---|---|---|---|---|
| X | X | X | O |   |
| X | X | O |   |   |
| X | O |   |   |   |
| O |   |   |   |   |

From these tables, it can be deduced that, in the most disadvantageous case (maximum number of possible candidates), there are m+1 possible candidates for determining the $n^{th}$ element of the list $U_{out}$, with $$n = \frac{m(m+1)}{2} + 1.$$

The function $$\psi(n) = \left\lceil \frac{-1 + \sqrt{-7 + 8n}}{2} \right\rceil$$

can then be deduced therefrom, which yields the maximum number of possible candidates for determining the $n^{th}$ element of the list $U_{out}$.

Since the function $\psi$ is ascending, the value $\psi(n)$ is maximum for the last iteration ($n=n_m'$) of the process for generating the list $U_{out}$. Consequently, irrespective of the element of the list $U_{out}$ to be determined, there are, at a maximum, $$\psi(n_m') = \left\lceil \frac{-1 + \sqrt{-7 + 8n_m'}}{2} \right\rceil$$

possible candidates.

According embodiments, it is proposed to use this result to reduce the number of operations (additions and comparisons) carried out by the elementary parity node. Specifically, given that the number of possible candidates for generating the list $U_{out}$ is, at a maximum, $p=\psi(n_m')$, it is proposed, according to the invention, to select only a small number, p, of possible candidates at each iteration of the process for generating the output list $U_{out}$, said possible candidates then being appropriately selected.

As previously, the method of the invention will be illustrated using tables showing the matrix $T_\Sigma$. In said tables, it is considered that $n_m=5$ and $n_m'=10$. As previously, a cross X represents a candidate element previously selected from the list $U_{out}$ and a circle O represents a possible candidate for the iteration in progress. We have $\psi(n_m')=4$, i.e., there is a list of 4 possible candidates for each iteration. At the first iteration (n=1), the 4 possible candidates are the first 4 elements of the first column of the matrix $T_\Sigma$, i.e., $T_\Sigma(1,1)$, $T_\Sigma(2,1)$, $T_\Sigma(3,1)$ et $T_\Sigma(4,1)$, as shown in the following table:

TABLE 10

|  | $U_1(1)$ | $U_1(2)$ | $U_1(3)$ | $U_1(4)$ | $U_1(5)$ |
|---|---|---|---|---|---|
| $U_2(1)$ | O |   |   |   |   |
| $U_2(2)$ | O |   |   |   |   |
| $U_2(3)$ | O |   |   |   |   |
| $U_2(4)$ | O |   |   |   |   |
| $U_2(5)$ |   |   |   |   |   |

The element selected for this first iteration (n=1) is $T_\Sigma(1,1)$. This element is extracted from the list of possible candidates and is replaced by $T_\Sigma(1,2)$. More generally speaking, each time that an element $T_\Sigma(i,j)$ is extracted from the list of candidates, it is known to replace it by the element $T_\Sigma(i,j+1)$.

For the next iteration (n=2), the list of candidates is illustrated by the following table.

TABLE 11

|        | $U_1(1)$ | $U_1(2)$ | $U_1(3)$ | $U_1(4)$ | $U_1(5)$ |
|--------|----------|----------|----------|----------|----------|
| $U_2(1)$ | X | O |   |   |   |
| $U_2(2)$ | O |   |   |   |   |
| $U_2(3)$ | O |   |   |   |   |
| $U_2(4)$ | O |   |   |   |   |
| $U_2(5)$ |   |   |   |   |   |

The fact of having a limited number of possible candidates can pose a problem in some situations, e.g., when the element $T_\Sigma(\psi(n_m'),1)$ is selected and then extracted as shown by the following table:

TABLE 12

|        | $U_1(1)$ | $U_1(2)$ | $U_1(3)$ | $U_1(4)$ | $U_1(5)$ |
|--------|----------|----------|----------|----------|----------|
| $U_2(1)$ | X | O |   |   |   |
| $U_2(2)$ | X | O |   |   |   |
| $U_2(3)$ | X | O |   |   |   |
| $U_2(4)$ | X | O |   |   |   |
| $U_2(5)$ |   |   |   |   |   |

If the law of replacement described above is applied, the element $T_\Sigma(4,1)$ extracted at the fourth iteration (n=4) is replaced with the element $T_\Sigma(4,2)$. Such being the case, $T_\Sigma(4,2)$ is not a "true" candidate since it is necessarily less than $T_\Sigma(3,2)$, which is already on the list of candidates. On the contrary, $T_\Sigma(5,1)$, which is a true candidate for the following iteration (n=5), is not on the list of candidates.

Therefore, in order to avoid this problem, it is proposed to modify the rule of replacement, at least for certain elements of the list of possible candidates.

According to a first embodiment, a flag D is used, which enables the selection of the element to be inserted into the list of candidates to be modified. Said flag D has two states: "horizontal" and "vertical". When the flag D is "horizontal," and when the element extracted from the list of candidates is $T_\Sigma(i,j)$, then the element $T_\Sigma(i,j)$, is replaced by the element $T_\Sigma(i,j+1)$ in the list of candidates. On the other hand, when the flag D is "vertical," and when the element extracted from the list of candidates is $T_\Sigma(i,j)$, then the element $T_\Sigma(i,j)$ is replaced by the element $T_\Sigma(i+1,j)$ in the list of candidates. At the beginning of the process of generating the list $U_{out}$, the flag is initialized in the "horizontal" state and remains in said state as long as the order i of the extracted element $T_\Sigma(i,j)$ is less than $\psi(n_m')$. When the order i of the extracted element $T_\Sigma(i,j)$ is greater than or equal to $p=\psi(n_m')$, the flag D changes state and shifts to the "vertical" state. It remains in the "vertical" state as long as the order j of the extracted element $T_\Sigma(i,j)$ is less than p. Finally, when the order j of the extracted element $T_\Sigma(i,j)$ is greater than or equal to p, the flag D shifts back to the "horizontal" state. The flag D therefore depends on the last index i or j to become greater than p.

If the example of the matrix $T_\Sigma$ defined in Table 1 is taken, then the elementary parity node is controlled as follows, with $n_m=10$, $n_m'=15$ and p=5.

At the start, the first p=5 elements of the list $U_1$ and the first element of the list $U_2$ are selected and they are added together so as to obtain the 5 following elements: $T_\Sigma(1,1)$, $T_\Sigma(2,1)$, $T_\Sigma(3,1)$, $T_\Sigma(4,1)$ and $T_\Sigma(5,1)$. These 5 elements then form the list of possible candidates for the first element of the output list $U_{out}$. The candidate element having the highest value is extracted, $T_\Sigma(1,1)=180$, in order to form the first element of the output list $U_{out}$ and, since the flag D is in the "horizontal" state, and since i=1<p, the flag D remains in the "horizontal" state and $T_\Sigma(1,1)$ is replaced by $T_\Sigma(1,2)$ in the list of possible candidates.

For the following iteration (n=2), the list of possible candidates includes the elements $T_\Sigma(1,2)$, $T_\Sigma(2,1)$, $T_\Sigma(3,1)$, $T_\Sigma(4,1)$ and $T_\Sigma(5,1)$. The candidate element having the highest value, $T_\Sigma(2,1)=177$, is extracted in order to become the second element of the output list $U_{out}$ and, since the flag D is in the "horizontal" state and since i=2<p, the flag D remains in the "horizontal" state and $T_\Sigma(2,1)$ is replaced by $T_\Sigma(2,2)$ in the list of possible candidates.

Iterations n=3 to n=12 are identical to iterations n=1 and n=2. Iterations n=1 to n=12 are shown in the following 12 tables, each table being associated with one iteration. The second column of each of the tables represents the list of candidate elements $T_\Sigma(i,j)$ for the iteration in question, and the first column represents the coordinates i and j of said candidate elements. The element extracted from the list of candidate elements during this iteration appears in bold characters in the table.

| i, j | n = 1<br>$T_\Sigma(i, j)$ |
|------|------|
| 1, 1 | 180 |
| 2, 1 | 177 |
| 3, 1 | 150 |
| 4, 1 | 145 |
| 5, 1 | 144 |

| i, j | n = 2<br>$T_\Sigma(i, j)$ |
|------|------|
| 1, 2 | 171 |
| 2, 1 | 177 |
| 3, 1 | 150 |
| 4, 1 | 145 |
| 5, 1 | 144 |

| i, j | n = 3<br>$T_\Sigma(i, j)$ |
|------|------|
| 1, 2 | 171 |
| 2, 2 | 168 |
| 3, 1 | 150 |
| 4, 1 | 145 |
| 5, 1 | 144 |

| i, j | n = 4<br>$T_\Sigma(i, j)$ |
|------|------|
| 1, 3 | 163 |
| 2, 2 | 168 |
| 3, 1 | 150 |
| 4, 1 | 145 |
| 5, 1 | 144 |

| i, j | n = 5<br>$T_\Sigma(i, j)$ |
|---|---|
| 1, 3 | 163 |
| 2, 3 | 160 |
| 3, 1 | 150 |
| 4, 1 | 145 |
| 5, 1 | 144 |

| i, j | n = 6<br>$T_\Sigma(i, j)$ |
|---|---|
| 1, 4 | 150 |
| 2, 3 | 160 |
| 3, 1 | 150 |
| 4, 1 | 145 |
| 5, 1 | 144 |

| i, j | n = 7<br>$T_\Sigma(i, j)$ |
|---|---|
| 1, 4 | 150 |
| 2, 4 | 147 |
| 3, 1 | 150 |
| 4, 1 | 145 |
| 5, 1 | 144 |

| i, j | n = 8<br>$T_\Sigma(i, j)$ |
|---|---|
| 1, 5 | 149 |
| 2, 4 | 147 |
| 3, 1 | 150 |
| 4, 1 | 145 |
| 5, 1 | 144 |

| i, j | n = 9<br>$T_\Sigma(i, j)$ |
|---|---|
| 1, 5 | 149 |
| 2, 4 | 147 |
| 3, 2 | 141 |
| 4, 1 | 145 |
| 5, 1 | 144 |

| i, j | n = 10<br>$T_\Sigma(i, j)$ |
|---|---|
| 1, 6 | 139 |
| 2, 4 | 147 |
| 3, 2 | 141 |
| 4, 1 | 145 |
| 5, 1 | 144 |

| i, j | n = 11<br>$T_\Sigma(i, j)$ |
|---|---|
| 1, 6 | 139 |
| 2, 5 | 146 |
| 3, 2 | 141 |
| 4, 1 | 145 |
| 5, 1 | 144 |

| i, j | n = 12<br>$T_\Sigma(i, j)$ |
|---|---|
| 1, 6 | 139 |
| 2, 6 | 136 |
| 3, 2 | 141 |
| 4, 1 | 145 |
| 5, 1 | 144 |

For iteration n=13, the list of candidate elements comprises the elements: $T_\Sigma(1,6)$, $T_\Sigma(2,6)$, $T_\Sigma(3,2)$, $T_\Sigma(4,2)$ and $T_\Sigma(5,1)$. The candidate element having the highest value, $T_\Sigma(\mathbf{5,1})$= 144, is extracted, in order to become the thirteenth element of the output list $U_{out}$. Since the flag D is in the "horizontal" state, and since i=5≥ψ($n_m'$), the flag D shifts to the "vertical" state and $T_\Sigma(5,1)$ is replaced by $T_\Sigma(6,1)$ in the list of possible candidates.

For iteration n=14, the list of candidate elements comprises the elements: $T_\Sigma(1,6)$, $T_\Sigma(2,6)$, $T_\Sigma(3,2)$, $T_\Sigma(4,2)$ and $T_\Sigma(6,1)$. The candidate element having the highest value, $T_\Sigma(3,2)$= 141, is extracted, in order to become the fourteenth element of the output list $U_{out}$. Since the flag D is in the "horizontal" state, and since i=3<p, the flag D remains in the "vertical" state and $T_\Sigma(3,2)$ is replaced by $T_\Sigma(4,2)$ in the list of possible candidates.

For iteration n=15, the list of candidate elements comprises the elements: $T_\Sigma(1,6)$, $T_\Sigma(2,6)$, $T_\Sigma(4,2)$, $T_\Sigma(4,2)$ and $T_\Sigma(6,1)$. The candidate element having the highest value, namely $T_\Sigma(4,2)$=136 or $T_\Sigma(2,6)$=136, is extracted in order to become the last element of the output list $U_{out}$.

These three iterations (n=13, n=14 and n=15) are illustrated by the following three tables:

| i, j | n = 13<br>$T_\Sigma(i, j)$ |
|---|---|
| 1, 6 | 139 |
| 2, 6 | 136 |
| 3, 2 | 141 |
| 4, 2 | 136 |
| 5, 1 | 144 |

| i, j | n = 14<br>$T_\Sigma(i, j)$ |
|---|---|
| 1, 6 | 139 |
| 2, 6 | 136 |
| 3, 2 | 141 |
| 4, 2 | 136 |
| 6, 1 | 120 |

| i, j | n = 15<br>$T_\Sigma(i, j)$ |
|------|------|
| 1, 6 | 139 |
| 2, 6 | 136 |
| 4, 2 | 136 |
| 4, 2 | 136 |
| 6, 1 | 120 |

It is to be noted that the list of possible candidates obtained at the end of step n=14 comprises the candidate element $T_\Sigma(4,2)$ twice, which reduces the size of said list. In order to prevent such a situation, it is advantageously verified whether or not the candidate element to be inserted into the list of possible candidates already belongs to said list. If such is the case, the element inserted into the list is then the element corresponding to the case wherein the state of the flag D would be the other state. The state of the flag D nevertheless remains unchanged for the following iterations. In the present case (iteration n=14), $T_\Sigma(3,2)$ is therefore replaced by $T_\Sigma(4,2)$ in the list of possible candidates and the flag D remains in the "vertical" state. The following list is obtained for the iteration n=15, and either element $T_\Sigma(4,2)=136$ or $T_\Sigma(2,6)=136$ is extracted in order to form the last element of the output list $U_{out}$.

| i, j | n = 15<br>$T_\Sigma(i, j)$ |
|------|------|
| 1, 6 | 139 |
| 2, 6 | 136 |
| 3, 3 | 133 |
| 4, 2 | 136 |
| 6, 1 | 120 |

In the end, the following output list is obtained $U_{out}=\{180, 177, 171, 168, 163, 160, 150, 150, 149, 147, 146, 145, 144, 141, 136\}$, which is identical to that obtained using the method of the prior art but with a limited number of operations.

According to the embodiments, the elementary parity node performs $\psi(n_m')$ additions and $\psi(n_m')$ comparisons for the first iteration (generation of the first element of the list $U_{out}$) and, for each of the following iterations (generation of $n_m'-1$ last elements of the list $U_{out}$), 1 addition and $\psi(n_m')$ comparisons. The generation of the complete list $U_{out}$ ($n_m'$ elements) therefore requires that $\psi(n_m')+n_m'-1$ additions and $\psi(n_m')*n_m'$ comparisons be performed. Alternatively, $p<\psi(n_m')$ can be selected in order to simplify the calculations, but this leads to a loss of optimization in terms of performance. It is then a matter of finding a good compromise between complexity and performance.

In the embodiment described above, selection of the candidate element which must replace the candidate element $T_\Sigma(i,j)$ extracted from the list of candidates is carried out on the basis of the flag D and the orders i and j. Alternatively, it is proposed to make this selection solely on the basis of the orders i and j.

According to this alternative embodiment, a replacement rule is defined, which is based solely on the orders i and j of the extracted candidate element. For example, considering a first list of possible candidates $T_\Sigma(1,1)$, $T_\Sigma(2,1)$, $T_\Sigma(3,1)$ and $T_\Sigma(4,1)$, the rule of replacement, for example, is defined as follows:

$\forall j \in [1, n_m]$, if $i \leq 2$, then candidate element $T_\Sigma(i,j)$ is replaced by candidate element $T_\Sigma(i,j+1)$ $\forall j \in [1, n_m]$, if $i \geq 4$, then candidate element $T_\Sigma(i,j)$ is replaced by candidate element $T_\Sigma(i+1,j)$ if i=3 and j=1, then candidate element $T_\Sigma(i,j)$ is replaced by candidate element $T_\Sigma(i,j+1)$ if $i \geq 3$ and j=2, then candidate element $T_\Sigma(i,j)$ is replaced by candidate element $T_\Sigma(i+1,j)$.

In terms of complexity, this alternative embodiment requires the same number of operations as the first embodiment for p=4.

In addition, since each element of the lists $U_1$ and $U_2$ represents an LLR value associated with a symbol in the Galois field GF(q), each element of the list of candidate elements is also associated with a symbol in the Galois field GF(q). Such being the case, it happens that the candidate element having the highest value is associated with a symbol which is likewise associated with an already known candidate value in the output list $U_{out}$. A single GF(q) symbol can in fact be associated with two different candidate elements $T_\Sigma(i+1,j)$. Advantageously therefore, after determining the candidate element having the highest value, the elementary parity node carries out a step for determining the symbol associated with said determined candidate element. The determined candidate element is then inserted into the output list $U_{out}$ if and only if the symbol which is associated therewith is not associated with a candidate element already present in the output list.

Figure 3:
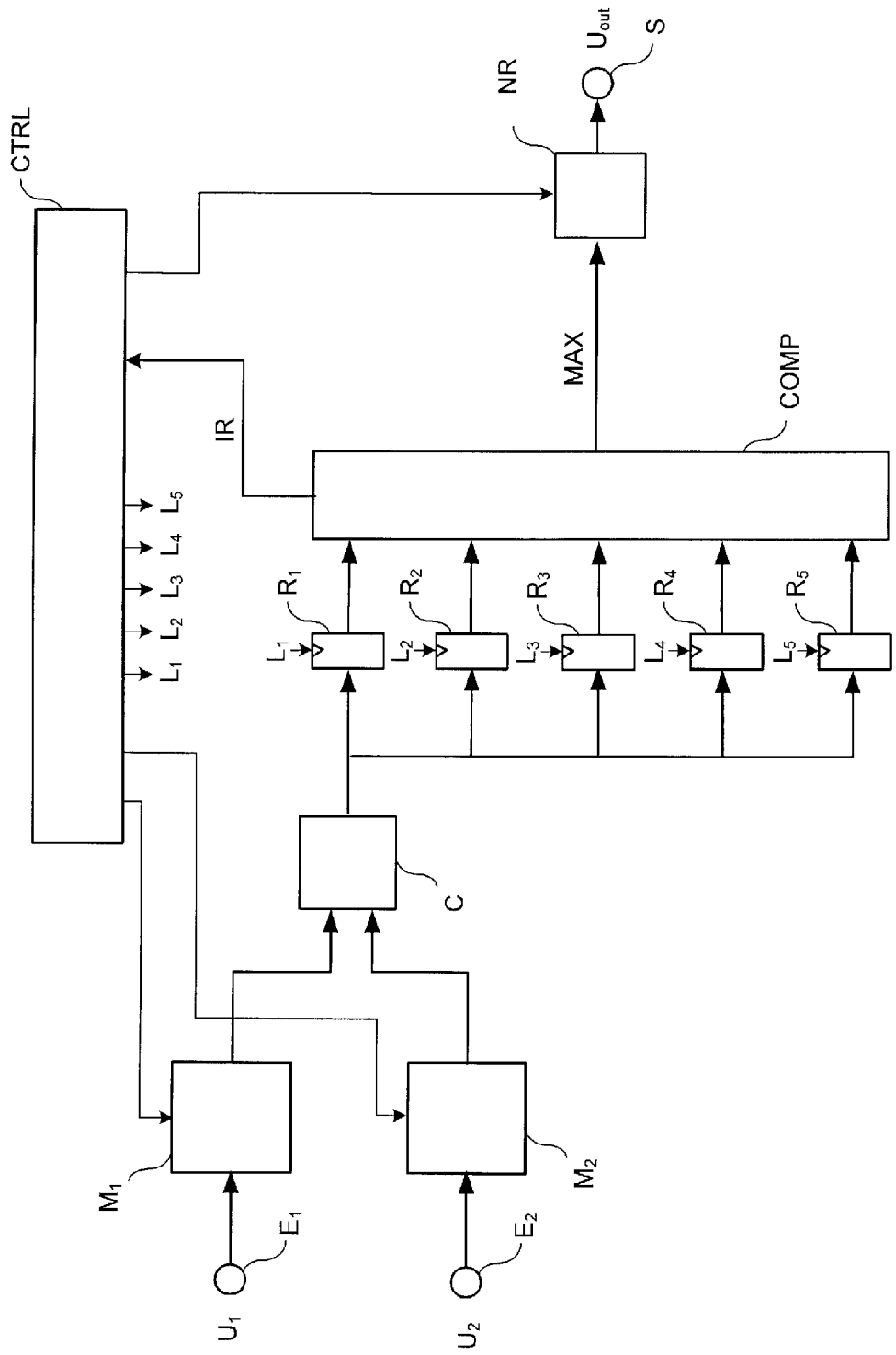
FIG. 3 shows the structure of an elementary parity node capable of implementing the method of the invention.

The structure of an elementary parity node capable of implementing the method of the invention is shown in FIG. 3. Said node includes two inputs $E_1$ and $E_2$ for receiving the input lists $U_1$ and $U_2$ to be processed, respectively, each of said lists comprising $n_m$ elements sorted in descending order, and an output S for delivering the output list $U_{out}$ generated by the elementary parity node, the output list including $n_m'$ elements sorted in descending order. The elementary parity node further includes:

storage means, such as memories M1 and M2, for saving the input lists $U_1$ and $U_2$ received at inputs E1 and E2, a computing circuit C for adding elements of the input list $U_1$ to elements of the input list $U_2$ in order to generate candidate elements, $p=\psi(n_m')$ registers $R_k$, $k \in [1, p]$ for storing the candidate elements computed by the computing circuit, a comparison circuit COMP for determining the candidate element having the highest value from amongst the candidate elements stored in the registers $R_k$, and for delivering information IR identifying the register $R_k$ from which the candidate element having the highest value is derived, a so-called redundancy suppression, NR unit, for deleting the candidate elements delivered by the comparison circuit which are associated with a GF(q) symbol already associated with an element supplied at the output S of the node, and a control circuit CTRL for receiving the information IR and for controlling all of the node circuits, in particular the memories $M_1$ and $M_2$, the registers $R_i$ and the redundancy suppression unit NR, according to the control method of the invention.

In the example of FIG. 3, the node comprises p=5 registers.

At the start of the method, the control circuit CTRL controls the memory $M_1$ such that it delivers the first p elements of list $U_1$ and memory $M_2$ such that it delivers the first element of list $U_2$. These elements added by the computing circuit C and the p results are stored in the p registers $R_k$. These p results comprise the list of possible candidates for the first element of the list $U_{out}$. These p results are then loaded into the comparison circuit COMP responsible for delivering the candidate element, referenced as MAX, having the highest value at the output S.

It should be noted that several comparison circuit structures are possible for delivering the candidate element MAX. According to a first structure, the comparison structure comprises p−1 elementary tree-mounted comparison circuits, each elementary circuit comparing two input values to one another. According to a second structure, the comparison circuit includes a different number of elementary comparison circuits arranged together so as to form an insertion sort structure known per se.

The comparison circuit COMP is also provided to provide to the control circuit the information IR identifying the register $R_k$ from which the candidate element MAX comes from. The information IR is generated from control signals from the elementary comparison circuits.

From the information IR and an internal register saving the coordinates (i, j) of the candidate elements $T_\Sigma(i,j)=U_1(i)+U_2(j)$ stored in the registers $R_k$, the control circuit determines the coordinates (i, j) of the candidate element MAX delivered by the comparison circuit COMP. Based on the state of the flag D saved in an internal register and said coordinates (i, j), it then determines the coordinates (i', j') of the next candidate element to be loaded into the comparison circuit. Based on the flag D, (i',j')=(i+1,j) or (i',j')=(i,j+1). The control circuit CTRL then controls the memories $M_1$ and $M_2$ in order that they deliver the elements $U_1(i')$ and $U_2(j')$ and controls the register $R_i$ identified in the IR information to save the candidate element $T_\Sigma(i',D=U_1(i')+U_2(j')$. In this way, only the register $R_i$ identified in the information IR is reloaded with a new candidate element.

The information IR is also used to delete the candidate elements delivered by the comparison circuit COMP which are associated with a GF(q) symbol already associated with an element provided at the output S of the node. The coordinates (i, j) determined from the information IR are used by the control circuit CTRL to determine the symbol associated with the candidate element $T_\Sigma(i,j)$ present at the output of the comparison circuit. This symbol information, referenced as IS, is, for example, recorded in a specific register, called symbol register, of the control circuit CTRL. Prior to each recording, the symbol information IS is, however, recorded compared to the symbol information already recorded in the register. If the symbol information is already present in the register, it means that the output list $U_{out}$ already comprises an element associated with the symbol contained in the information IS. In this case, the circuit CTRL controls the unit NR so that it does not provide the candidate element $T_\Sigma(i,j)$ to the output S. If the symbol information IS is not already present in the symbol register, it is recorded therein and the unit NR provides the candidate element $T_\Sigma(i,j)$ to the output S.

As can be seen in FIG. 3, said elementary parity node comprises a limited number (p=ψ($n_m$')) of registers. It therefore enables a limited number of elementary comparison circuits to be used in the comparison circuit COMP. It also enables shorter waiting times than conventional elementary parity nodes.

In order to accelerate the elementary parity node rate, it is also possible to generate the output list $U_{out}$ by processing the input lists in blocks of several elements. The elementary parity node means are then duplicated in order to enable parallel processing of the block elements.

Although the invention has been described in connection with various particular embodiments, it is quite obvious that it is in no way limited thereto and that it includes all technical equivalents of the means described as well as the combinations thereof, provided that same fall within the scope of the invention.

Embodiments of the invention have been described, in particular, within the context of the input and output lists comprising the elements belonging to a Galois field GF(q), however, more generally speaking, it is applicable to any list including elements belonging to a set provided with at least one internal composition law.

In addition, embodiments have been described within the context of an output list including elements which are the results of addition operations between elements of the input lists. More generally speaking, the invention applies to computing operations φ wherein φ is a function such that, if a≥b and c≥d, then φ(a, c)≥φ(b, d).

On the other hand, in the previously described embodiments, the list of possible candidates for each element of the output list $U_{out}$ includes p=ψ($n_m$') candidate elements, but, of course, p can be selected differently, provided, however, that p is less than $n_m$, in order to reduce the number of comparisons. It may be less than ψ($n_m$') (less than optimal solution) or greater than $n_m$ (more than optimal solution).

The above-described method for controlling an elementary parity node can, of course, be applied to any decoder using at least one non-binary parity constraint.

Finally, the embodiments have been described within the scope of an elementary parity node for generating, from two input lists sorted in descending order, an output list sorted in descending order, which comprises the highest values of the two input lists. The invention is also applicable to an elementary parity node for generating, from two input lists sorted in ascending order, an output list sorted in ascending order, which comprises the lowest values of the two input lists, by selecting the lowest value of the list of candidates at each iteration of the method. Said elementary parity node, for example, can be used in a receiver capable of receiving modulated signals according to a QAM modulation (Quadrature Amplitude Modulation). The node is then used to determine, from amongst the constellation symbols, those symbols closest to the symbol received. If the constellation is shown in an (x, y) diagram, the first input list, for example, shows the squared x-axis deviations, sorted in ascending order, between the symbol received and the symbols of the constellation, and the second input list shows the squared y-axis deviations, sorted by ascending order, between the symbol received and the symbols of the constellation. The function φ is then φ(x, y)=x+y, in order to obtain as output the list of the $n_m$ closest symbols or points of the constellation of the symbol received, said list being sorted by ascending quadratic distance.

The invention claimed is:

1. A method for controlling an elementary parity node of a decoder for decoding non-binary LDPC codes or a code decoder using at least one non-binary parity constraint, said elementary parity node receiving first and second lists ($U_1$, $U_2$), referred to as first and second input lists, having $n_m$ elements sorted in an order defined among a descending order and an ascending order, $n_m$ being greater than 1, and delivering a list ($U_{out}$), referred to as the output list, having $n_m$' elements sorted in said defined order, $n_m$' being greater than 1, each element of the output list ($U_{out}$), being the result of a computing operation φ between an element of the first input list ($U_1$) and an element of the second input list ($U_2$), said computing operation φ being such that, if a≥b and c≥d, then φ(a, c)≥φ(b, d), said method including the following steps:

a) selecting the p first elements of the first input list ($U_1$) and the first element of the second input list ($U_2$), p being a predetermined number less than $n_m$, b) carrying out computing operations φ between the elements selected from the first input list ($U_1$) and the element selected from the second input ($U_2$) list so as to generate a list of p candidate elements for the output list, c) determining, from among the p candidate elements, the candidate element having the highest value if the defined order is the descending order, or the candidate element having the lowest value if the defined order is the ascending order, and inserting it into the output list ($U_{out}$), the candidate element inserted into the output list being the result of the computing operation φ between an element of order i of the first input list and an element of order j of the second input list, i and j being between 1 and $n_m$, d) selecting, according to a predetermined criterion, the element of order i of the first input list and the element of order j+1 of the second input list or the element of order i+1 of the first input list and the element of order j of the second input list, e) carrying out a computing operation φ between the elements selected in the d) step so as to generate a new candidate element, and replacing, in the list of p candidate elements, the last candidate element inserted into the output list by said new candidate element, f) determining, from among the p candidate elements, the candidate element having the highest value if the defined order is the descending order, or the candidate element having the lowest value if the defined order is the ascending order, and inserting it into the output list ($U_{out}$) in the order of determination, the candidate element inserted into the output list being the result of the computing operation between an element of order i of the first input list and an element of order j of the second input list, and g) repeating steps d) to f) until the output list comprises $n_m'$ elements.

2. The method according to claim 1, wherein the number p is equal to $$\left\lceil \frac{-1+\sqrt{-7+8n_m'}}{2} \right\rceil$$

wherein ⌈x⌉ represents the smallest integer greater than or equal to the real number x.

3. The method according to claim 1, wherein, according to a first predetermined criterion, the selection made in step d) depends on the order i of the element of the first input list ($U_1$) and/or the order j of the element of the second input list (U2) associated with the candidate element inserted into the output list.

4. The method according to claim 1, wherein, according to a predetermined criterion, the selection made in step d) depends on the order i of the element of the first input list ($U_1$) and the order j of the element of the second input list ($U_2$) associated with the candidate element inserted into the output list and on a flag representative of the selection made in the preceding step d).

5. The method according to claim 1, wherein the elements of the first and second input lists and the output list are log likelihood ratios.

6. The method according to claim 5, wherein the computing operation is an addition operation.

7. The method according to claim 1, wherein, each of the elements of said first and second input lists ($U_1$,$U_2$) being associated with a symbol in the Galois field, the step f) further includes, after determining the candidate element having the lowest or highest value, a step for determining the symbol associated with said determined candidate element, said determined candidate element being inserted into the output list if and only if the symbol associated with said determined candidate element is not associated with a candidate element present in the output list.

8. An elementary parity node, including:

first and second inputs for receiving first and second lists, said first and second input lists ($U_1$,$U_2$), having $n_m$ elements sorted in an order defined among a descending order and an ascending order, $n_m$ being greater than 1, an output for delivering a list ($U_{out}$), referred to as an output list, having $n_m'$ elements sorted in the defined order, $n_m'$ being greater than or equal to 1, each element of the output list being the result of a computing operation φ between an element of the first input list and an element of the second input list, said computing operation φ being such that, if a≥b and c≥d then φ(a, c)≥φ(b, d), first storage means for storing the elements of said first and second input lists ($U_1$,$U_2$), a computing circuit for carrying out computing operations φ between the elements of the first input list and the elements of the second input list, which are stored in said first storage means, so as to generate a candidate element upon each operation, second storage means for storing the candidate elements computed by said computing means, a comparison circuit for determining, from among the candidate elements stored in the second storage means, the candidate element having the highest value if the defined order is the descending order, or the candidate element having the lowest value if the defined order is the ascending order, and providing said determined candidate element to the output, the candidate element provided to the output being the result of the computing operation φ between an element of order i of the first input list and an element of order j of the second input list, i and j being between 1 and $n_m$, and a control circuit for controlling the selection of the elements stored in said first storage means, to be provided to the computing circuit and storage of the computed candidate elements in the second storage means, wherein the second storage means include p registers for storing p candidate elements, p being a predetermined number lower than $n_m$, the comparison circuit is capable of providing information to the control circuit, which is representative of the orders i and j associated with said candidate element provided to the output, and the control circuit is capable of controlling said first storage means and said second storage means for implementing the control method according to claim 1.

* * * * *

UNITED STATES PATENT AND TRADEMARK OFFICE
CERTIFICATE OF CORRECTION

Page 1 of 1

PATENT NO. : 8,645,787 B2
APPLICATION NO. : 13/319033
DATED : February 4, 2014
INVENTOR(S) : Boutillon et al.

It is certified that error appears in the above-identified patent and that said Letters Patent is hereby corrected as shown below:

In the Specification

Column 6, Line 43:
Delete "$U_2\ (i)$" and insert -- $U_2\ (j)$ --.

Column 17, Line 31:
Delete "$T_\Sigma(i',D)$" and insert -- $T_\Sigma(i',j')$ --.

Signed and Sealed this
Fifteenth Day of September, 2015

Michelle K. Lee
*Director of the United States Patent and Trademark Office*